United States Patent

Hirasawa et al.

[11] 3,949,242
[45] Apr. 6, 1976

[54] LOGICAL CIRCUIT FOR GENERATING AN OUTPUT HAVING THREE VOLTAGE LEVELS

[75] Inventors: Masataka Hirasawa; Akira Hashimoto, both of Yokohama, Japan

[73] Assignee: Tokyo Shibaura Electric Co., Ltd., Japan

[22] Filed: May 6, 1975

[21] Appl. No.: 575,065

[30] Foreign Application Priority Data
May 9, 1974 Japan.................. 49-51452

[52] U.S. Cl.................. 307/205; 58/50 R; 307/209; 307/270; 340/336; 350/160 LC
[51] Int. Cl.² ..................... H03K 19/08; G08B 5/36
[58] Field of Search ........... 307/205, 209, 214, 270; 58/23 A, 50 R; 340/166 EL, 324 M, 336; 350/160 LC

[56] References Cited
UNITED STATES PATENTS

| | | | |
|---|---|---|---|
| 3,604,952 | 9/1971 | Regitz............................ | 307/209 X |
| 3,740,570 | 6/1973 | Kaelin et al................ | 340/324 M X |
| 3,781,864 | 12/1973 | Fujita............................. | 58/50 R X |
| 3,842,411 | 10/1974 | Naito............................. | 58/50 R X |
| 3,896,318 | 7/1975 | Mitsui............................. | 58/50 R X |
| 3,896,430 | 7/1975 | Hatsukano.......................... | 340/336 |
| 3,899,691 | 8/1975 | Hama.............................. | 58/23 A |

Primary Examiner—Stanley D. Miller, Jr.
Assistant Examiner—L. N. Anagnos
Attorney, Agent, or Firm—Cushman, Darby & Cushman

[57] ABSTRACT

A logical circuit comprises a circuit having a plurality of insulated gate field effect transistors of different channel types and three terminals to which are connected corresponding voltage sources each having a different voltage level, and means for supplying first, second and third logical signals having the maximum and minimum voltage levels of the above-mentioned three different voltage levels to the circuit so that only one current path is always created between an output terminal of the circuit and any one of the three terminals. As a result, the logical circuit can generate an output having three logical levels.

2 Claims, 6 Drawing Figures

LOGICAL CIRCUIT FOR GENERATING AN OUTPUT HAVING THREE VOLTAGE LEVELS

This invention relates to a complementary logical circuit using insulated gate field effect transistors of different channel types, and in particular to a logical circuit for generating an output signal having three logical levels.

As an electronic timepiece or a display device for a portable table-top calculator an attention is paid to a display device of low power consumption using a liquid crystal. The liquid crystal display device (hereinafter referred to as an LC display device) requires a high driving voltage. Even in the case of a static display, for example, a signal applied to the display segments of the LC display device should have a voltage of the order of 6 to 10V. In this case, however, it is necessary that a segment signal be sent independently to each of a group of display segments corresponding to each of orders or digits representative of a character or a numeral--for convenience sake an explanation will be restricted hereinafter to the case where only the 'numeral' is used. If an 8-digit numeral is displayed using eight display segments for each digit of the number, 8 × 8 (= 64) segment signals are required. That is, the number of segment signals required is increased with the consequent disadvantage. Where these 64 segment signals are supplied from an IC circuit to the display device, the corresponding 64 output lines should be taken out from the IC circuit, thus making very intricate a connection between the IC circuit and the LC display device. An increase in the number of output signals from the IC circuit is not desirable taking the following into consideration.

a. The connection between the IC circuit and the LC display device should be simplified with the enhancement of the device as a whole.
b. The electronic timepiece or the display device for the table-top calculator should be miniaturized using an IC circuit, particularly, an LSI circuit.
c. The cost of the IC circuit is greatly dependent on the number of pins (i.e. the number of input pins plus the number of output pins plus the number of power source pins).

A scanning display system or dynamic display system in which a display digit designating signal (a digit signal) is applied, together with a display segment signal, to the LC display device has been proposed in an attempt to decrease the number of driving signals in the LC display device. That is, a display digit is designated by a digit signal having a multi-level voltage, for example, 3-level voltage as shown in FIG. 1 and a display is effected only in those segments of the display system where a voltage difference between the digit signal and the display segment signal attains more than a predetermined value, for example, 18V. Such a display system, with the following taking into consideration, can perform a dynamic display by forming a multi-voltage level difference between the digit signal and the segment signal as shown in FIG. 1:

A. The LC display device effects a display operation when an electric field of more than a predetermined magnitude is applied, irrespective of its sense or direction, to the LC display device during a time period exceeding a predetermined length of time.
B. It is desirable that, in order to extend an LC life, the integrated value of a leak current of both directions through the liquid crystal becomes zero.
C. The response time of the liquid crystal is very slow compared with that of the other display device, for example, a light emission diode, digitron or nixi tube.

Consequently, means for generating an output having at least three levels is required.

It is accordingly the object of this invention to provide a low power consumption type logical circuit for generating an output having three logical levels of predetermined magnitudes.

In one aspect of this invention there is provided a logical circuit comprising at least one unit logical circuit including means for connecting through series-connected first and second insulated gate field effect transistors of one conductivity type to an output terminal a first terminal held at a first potential level; means for connecting through series-connected first and second insulated gate field effect transistors of the other conductivity type to the output terminal a second terminal held at a second potential level different from the first potential level; means for connecting through at least one of two third insulated gate field effect transistors to the output terminal a third terminal held at a third potential level different from the first and second potential levels, one of the two third insulated gate field effect transistors being of said one conductivity type and having a gate electrode connected to a gate electrode of the second insulated gate field effect transistor of said other conductivity type and the other being of said other conductivity type and having a gate electrode connected to a gate electrode of the second insulated gate field effect transistor of said one conductivity type; means for supplying to each gate electrode of the first insulated gate field effect transistor of said one conductivity type and the first insulated gate field effect transistor of said other conductivity type a first logical signal having said first and second voltage levels to cause one of the two first insulated gate field effect transistors to be turned ON and the other to be turned OFF; means for supplying to the second insulated gate field effect transistor of said one conductivity type a second logical signal having said first and second potential levels to cause this transistor to be turned ON and OFF; and means for supplying a third logical signal to the gate electrode of said second insulated gate field effect transistor of said other conductivity type to cause this transistor to be turned ON and OFF, said third logical signal being opposite in polarity to the second logical signal and having said first and second potential levels; said unit logical circuit being so constructed that only one current path is always created between the output terminal and any one of the first, second and third terminals.

In another aspect of this invention there is provided a logical circuit comprising a plurality of unit logical circuits in which outputs each having three levels can be generated from the corresponding unit logical circuits without being overlapped timewise with respect to each other.

Since according to this invention three potentials, different in level from each other, corresponding to the respective three potential sources are coupled to the output terminal of the logical circuit without being overlapped timewise with respect to each other, the three logical levels of the output are each made constant, thus providing a logical circuit of low power consumption.

This invention will be more fully understood from the following detailed description when taken in conjunction with the accompanying drawings, in which.

Figure 1:
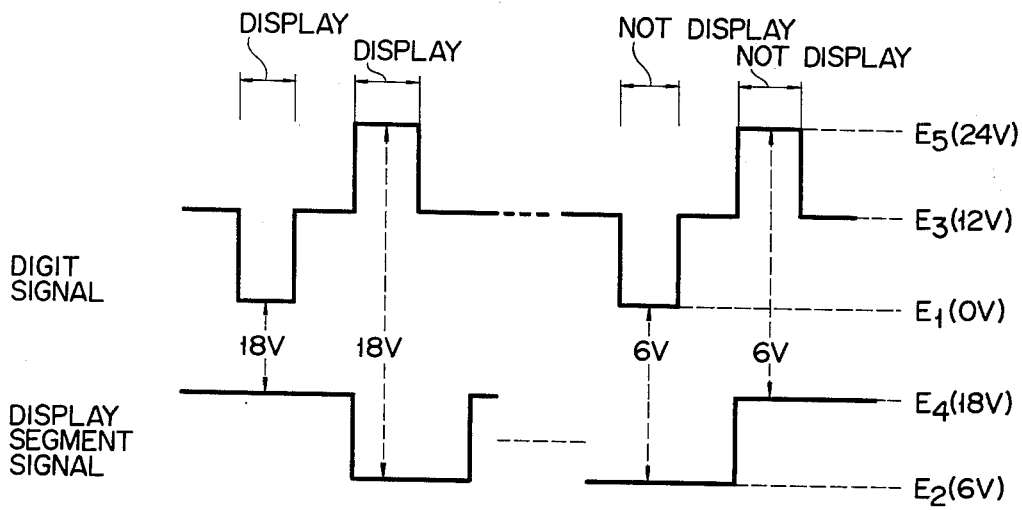
FIG. 1 is a waveform diagram showing a relation between a digit signal and a display segment signal which are used in effecting a dynamic display of a liquid crystal.
Figure 2:
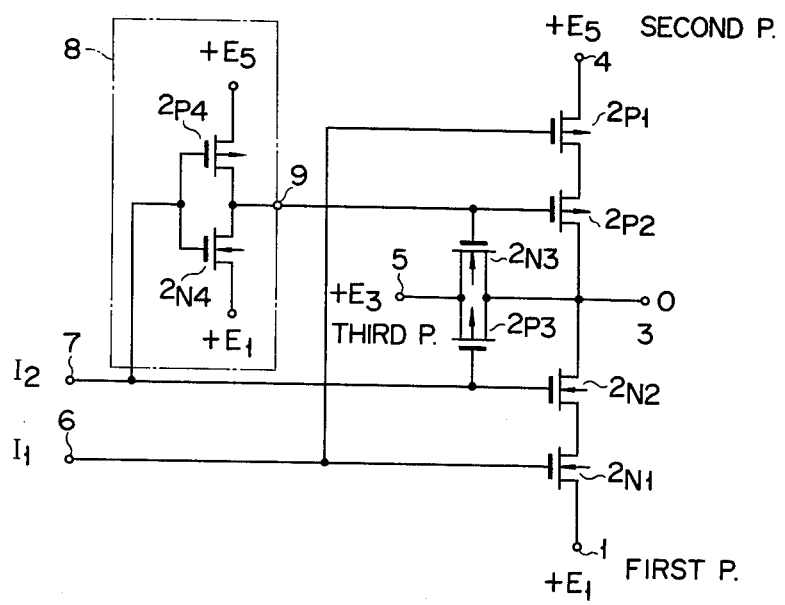
FIG. 2 is a unit logical circuit arrangement according to one embodiment of this invention.

In FIG. 2 a first terminal maintained at a first potential level $+E_1 = 0V$ is connected to the source electrode of a first N-channel type of insulated gate field effect transistor $2_{N1}$ (insulated gate field effect transistor is hereinafter referred to as IG-FET). The drain electrode of the IG-FET $2_{N1}$ is connected to the source electrode of a second N-channel type IG-FET $2_{N2}$ whose drain electrode is connected to an output terminal 3. A second terminal 4 maintained at a second potential level $+E_5 = 24V$ is connected to the source electrode of a P-channel type FET $2_{P1}$ and the drain electrode of the FET $2_{P1}$ is connected to the source electrode of a second P-channel type IG-FET $2_{P2}$. The drain electrode of the FET $2_{P2}$ is connected to the output terminal 3. A third terminal 5 maintained at a third potential level $+E_3$ is connected to the output terminal 3 through a parallel channel consisting of a third N-channel type IG-FET $2_{N3}$ and third P-channel type IG-FET $2_{P3}$. A terminal 6 adapted to be supplied with a first logical signal $I_1$ is connected to the gate electrodes of the first N-channel type FET $2_{N1}$ and P-channel type IG-FET $2_{P1}$ and a terminal 7 adapted to receive a second logical signal $I_2$ is connected to the gate electrodes of the second N-channel type IG-FET $2_{N2}$ and third P-channel type IG-FET $2_{P3}$. Within the unit logic circuit of FIG. 2 is further provided an inverter 8 of a series circuit consisting of an N-channel type IG-FET $2_{N4}$ whose source electrode is maintained at said first potential level and a P-channel type IG-FET $2_{P4}$ whose source electrode is maintained at said second potential level. The second logical signal $I_2$ is coupled to the gate electrodes of the IG-FET's $2_{N4}$ and $2_{P4}$ both constituting said inverter 8. The second logical signal $I_2$ is inverted at the inverter 8 to generate a third logical signal $\bar{I}_2$ at an output terminal 9 of the inverter. The output terminal 9 is connected to the gate electrodes of the second P-channel type IG-FET $2_{P2}$ and third N-channel type IG-FET $2_{N3}$.

There will now be explained the operation of the circuit shown in FIG. 2.

Figure 3:
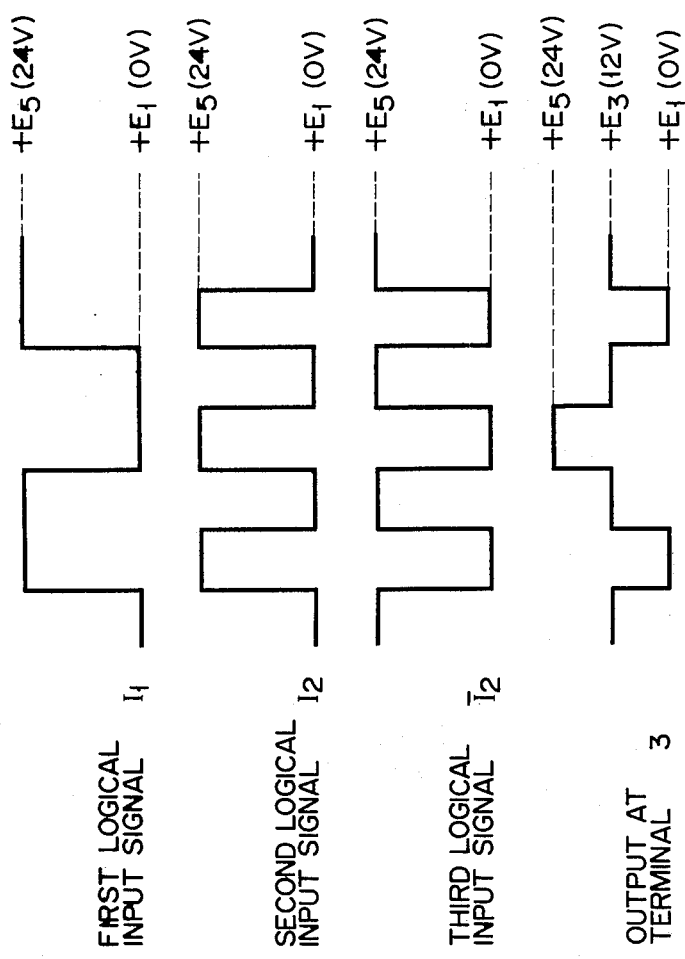
FIG. 3 is a waveform diagram showing a relation between signals applied to the circuit arrangement of FIG. 2 and the outputs of the circuit arrangement.

FIG. 3 shows, by way of example, the waveforms of the first, second, third logical signals, and the output signal. When the second logical signal $I_2$ is in the $+E_1$ level, the FET $2_{N2}$ is turned OFF nad the FET $2_{P3}$ is turned ON. Since at this time the output terminal 9 of the inverter 8 is maintained at the potential level $+E_5$, the FET $2_{P2}$ is turned OFF and the FET $2_{N3}$ is turned OFF. As a result, irrespective of the level of the first logical signal $I_1$ a current path between the output terminal 3 and the first terminal 1 ($+E_1$) is interrupted by the FET $2_{N2}$ and a current path between the output terminal 3 and the second terminal 4 ($+E_5$) is interrupted by the FET $2_{P2}$ and only a current path between the output terminal 3 and the third terminal 5 ($+E_3$) is held in the conductive state. While the second logical signal $I_2$ is in the $+E_1$ level, an output of the level $+E_3$ appears at the output terminal 3.

When the second logical signal $I_2$ attains the $+E_5$ level, the FET $2_{P3}$ is turned OFF and the FET $2_{N2}$ is turned ON. Since the output terminal 9 of the inverter 8 is in the $+E_1$ potential level, the FET $2_{N3}$ is turned OFF and the FET $2_{P2}$ is turned ON. Consequently, irrespective of the level of the first logical singal $I_1$ the current path between the output terminal 3 and the third terminal 5 ($+E_3$) is interrupted due to the simultaneous interruption of the FET's $2_{P3}$ and $2_{N3}$. At this time, depending on the level of the logical signal $I_1$ a current path may exist between the output terminal 3 and the first terminal 1 ($+E_1$) or between the output terminal 3 and the second terminal 4 ($+E_5$). When, however, the first logical signal $I_1$ is in the $+E_1$ level, the FET $2_{N1}$ is turned OFF and the FET $2_{P1}$ is turned ON and the current path between the output terminal 3 and the first terminal 1 ($+E_1$) is interrupted by the FET $2_{N1}$. Since at this time a current path exists only between the output terminal 3 and the second terminal 4 ($+E_5$), an output of the $+E_5$ level appears at the output terminal 3. When, on the other hand, the first logical signal $I_1$ is in the $+E_5$ level, the FET $2_{P1}$ is turned OFF and the FET $2_{N1}$ is turned ON and the current path between the output terminal 3 and the second terminal 4 ($+E_5$) is interrupted by the FET $2_{P1}$. In consequence, a current path exists only between the output terminal 3 and the first terminal 1 ($+E_1$) and an output with the $+E_1$ level is generated from the output terminal 3.

As will be evident from the above explanation, the outputs having three logic levels i.e. $+E_1$, $+E_3$ and $+E_5$ can be obtained according to this invention. As far as the requirements of this invention are satisfied, only one current path can always exist between the output terminal 3 and the first, second or third terminal ($+E_1$, $+E_5$ or $+E_3$). Since in the normal state no direct current flows between the first, second and third terminals 1, 4 and 5 it is possible to obtain a logic circuit involving a low power consumption. Furthermore, since the power sources $E_1$, $E_3$ and $E_5$ are each maintained at the constant level, the corresponding output is held at the predetermined level.

In the above-mentioned embodiment explanation is restricted to the case where the second logical signal $I_2$ is inverted at the inverter 8 and the inverted signal is applied as the third logical signal $\bar{I}_2$ to the gate electrodes of the FET's $2_{P2}$ and $2_{N3}$. It is also possible, however, to apply the third logical signal $\bar{I}_2$ directly to the gates of the FET's $2_{P2}$ and $2_{N3}$, invert the third logical signal $I_2$ by, for example, an inverter not shown and apply the inverted logical signal $I_1$ to the gate electrodes of the FET's $2_{N2}$ and $2_{P3}$.

Now consider the case where a current between the output terminal 3 and the third terminal 5 ($+E_3$) i.e. a current from the output terminal, to the third terminal 5 or from the third terminal 5 to the output terminal 3, is not made great. If in this case the following equation (1) is satisfied, the FET $2_{P3}$ can be omitted in view of the bidirectionality of the IG-FET and the current path between the output terminal 3 and the third terminal 5 (+$E_3$) can be established using the FET $2_{N3}$ alone.

$$|E_5 - E_1| > |E_5 - E_3| + |V_{thN3}| \ldots \quad (1)$$

Where, on the other hand, the following second equation (2) is satisfied, the FET $2_{N3}$ can be omitted and a current path between the output terminal 3 and the third terminal 5 (+$E_3$) can be provided using the FET $2_{P3}$ alone.

$$|E_5 - E_1| > |E_5 - E_3| + |V_{thP3}| \ldots \quad (2)$$

The $V_{thP3}$ and $V_{thN3}$ denote, respectively, threshold voltages when the FET's $2_{P3}$ and $2_{N3}$ are modulated by a back gate bias. To explain in more detail, with the IC circuit of FIG. 2 using, for example, a "silicon on sapphire" as a substrate, the base plate and potential supply terminal of each FET--the potential supply terminal is a drain electrode when the FET is used in the source follower mode and a source electrode when the FET is used in the source grounded mode--can be connected independently to a potential source. Since a back gate bias corresponding to a forward voltage of a diode formed between the source electrode and base plate of each FET is only applied between the source electrode and the base plate of each FET, any influence of said back gate bias over the FET's $2_{P3}$ and $2_{N3}$ can be disregarded. Where, however, the N-type semiconductor, for example, is used as a substrate, at least the base plates of the P-channel type FET's must be connected in common with each other and, for example, a potential +$E_5$ is applied to the common substrate. Consequently, when the FET $2_{P3}$ is turned ON, a back gate bias ($E_5 - E_3$) is applied to the FET $2_{P3}$. Likewise, when the base plate of the FET $2_{N3}$ is in the +$E_1$ potential, a back gate bias ($E_3 - E_1$) is applied to the FET $2_{N3}$. Thus, the threshold voltage of each FET can be modulated in a direction in which the threshold voltage of each FET of the enhancement type is increased.

Figure 4:
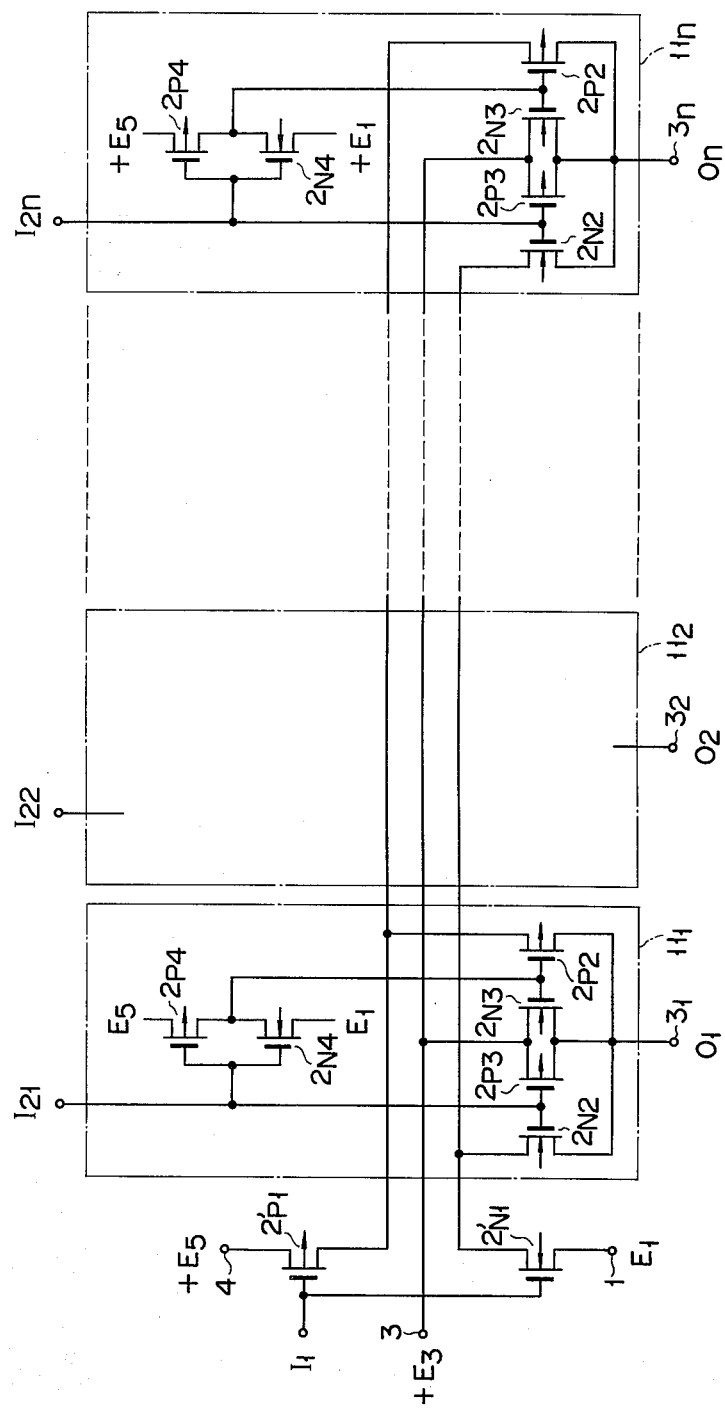
FIG. 4 is a circuit arrangement according to another embodiment of this invention.
Figure 5:
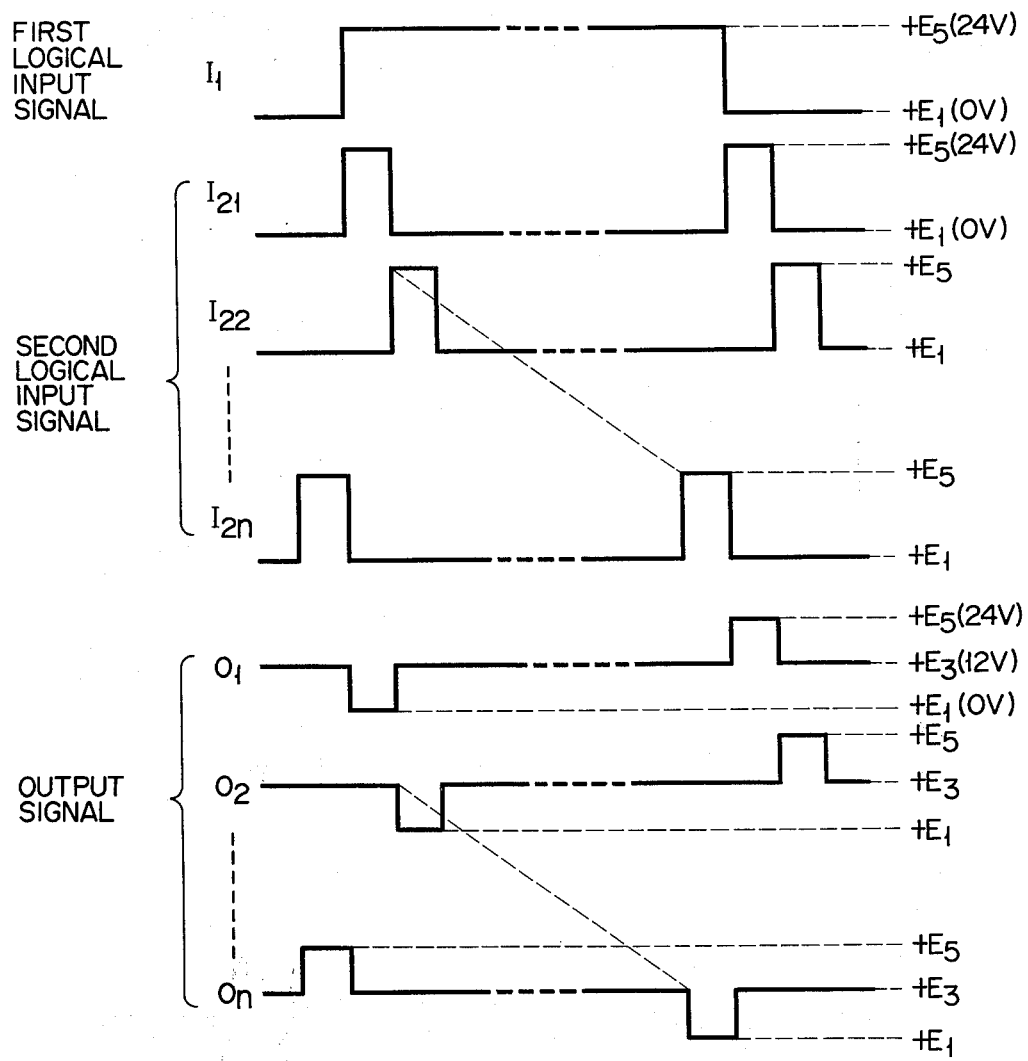
FIG. 5 is a waveform diagrmm showing a relation between signals applied to the circuit arrangement of FIG. 4 and the outputs of the circuit arrangement.

FIG. 4 shows another embodiment according to this invention. Unit logic circuits $11_1$ to $11_n$, which are obtained by modifying the unit logic circuit of FIG. 2 as will be described later, are arranged in the order mentioned. Second logical signals $I_{21}$ to $I_{2n}$ and outputs $O_1$ to $O_n$ at output terminals $3_1$ to $3_n$ are each expressed with a suffix added to the corresponding unit logic circuit. With the circuit arrangement shown in FIG. 4 the P-channel type IG-FET $2_{P1}$ of each unit logic circuit is replaced by a single P-channel type IG-FET $2'_{P1}$ and the N-channel type IG-FET $2_{N1}$ of each unit logic circuit is replaced by a single N-channel type IG-FET $2'_{N1}$. A first logical signal $I_1$ is supplied commonly to each gate electrode of the FET's $2'_{P1}$ and $2'_{N1}$. First, second and third terminals 1, 4 and 5 are each maintained at the potential level as explained in connection with the circuit of FIG. 2. The arrangement permits the number of FET's required to be reduced. The second logical signals $I_{21}$ to $I_{2n}$ are supplied in a form not to be overlapped timewise with respect to each other (for example, the potential levels +$E_5$ are not overlapped timewise with respect to each other). It is, therefore, possible to obtain from the output terminals $3_1$ to $3_n$ outputs $O_1$ to $O_n$ having three logical levels ($E_1$, $E_3$ and $E_5$) time-displaced with respect to each other. The +$E_1$ potential levels, and +$E_5$ potential levels, of the respective outputs $O_1$ to $O_n$ are not overlapped timewise with respect to each other. As shown in FIG. 5 the order and position of each of the second logical signals $I_{21}$ to $I_{2n}$ determine the order and position of each of the corresponding output signals $O_1$ to $O_n$.

Figure 6:
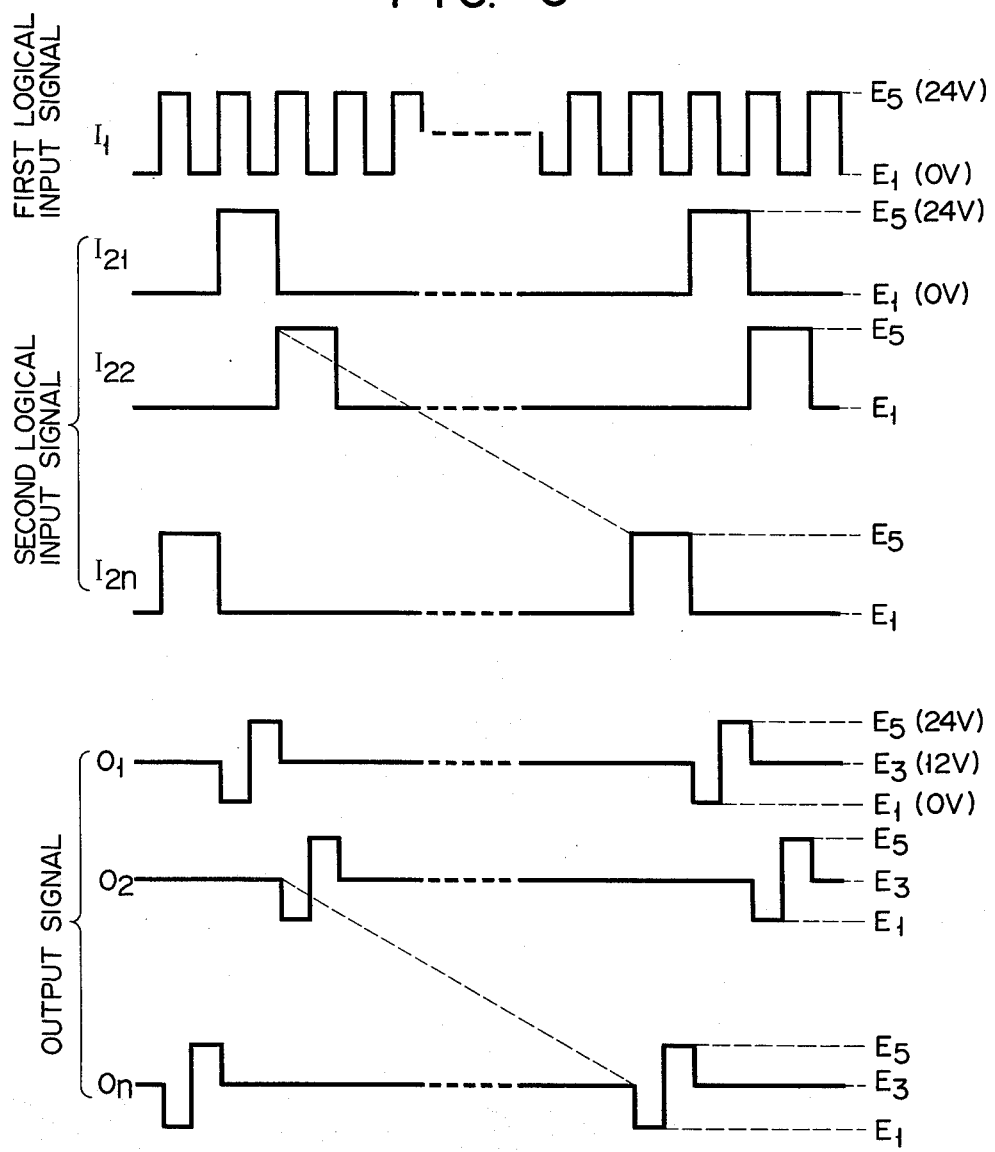
FIG. 6 is another waveform diagram showing a relation between signals applied to the circuit arrangement of FIG. 4 and the outputs of the circuit arrangement.

Though with the embodiment of FIG. 4 both the FET's $2'_{P1}$ and $2'_{N1}$ are each used as a single common FET, it will be understood that either one of the FET's $2'_{P1}$ and $2'_{N1}$ may be employed as a single common FET. In the embodiment shown in FIG. 4 the half cycle of the first logical signal $I_1$ has been explained as corresponding to one cycle of the second logical signals $I_{21}$ to $I_{2n}$, but this invention is not restricted thereto. That is, use may be made, as the first logical signal $I_1$, of a logical signal having a predetermined time relation to the second logical signals $I_{21}$ to $I_{2n}$ and a cycle shorter than that of the second logical signal. As shown in FIG. 6, for instance, output signals $O_1$ to $O_n$ varying in level from $E_1$ to $E_5$ during one cycle of the first logical signal $I_1$ can be obtained by making the frist logical signal shorter in cycle than the second logical signal.

What we claim is:

1. A logical circuit comprising at least one unit logical circuit including means for connecting through series-connected first and second insulated gate field effect transistors of one conductivity type to an output terminal a first terminal maintained at a first potential level; means for connecting through series-connected first and second insulated gate field effect transistors of the other conductivity type to said output terminal a second terminal maintained at a second potential level different from said first potential level; means for connecting through at least one of two third insulated gate field effect transistors to said output terminal a third terminal maintained at a third potential level different from said first and second potential levels, one of said two third insulated gate field effect transistors being of said one conductivity type and having a gate electrode connected to a gate electrode of said second insulated gate field effect transistor of said other conductivity type and the other being of said other conductivity type and having a gate electrode connected to a gate electrode of said second insulated gate field effect transistor of said one conductivity type; means for supplying to each gate electrode of said first insulated gate field effect transistor of said one conductivity type and said first insulated gate field effect transistor of said other conductivity type a first logical signal having said first and second potential levels to cause one of said two first insulated gate field effect transistors to be turned ON and the other to be turned OFF; means for supplying to said second insulated gate field effect transistor of said one conductivity type a second logical signal having said first and second potential levels to cause said transistor to be turned ON and OFF; and means for supplying a third logical signal to the gate electrode of said second insulated gate field effect transistor of said other conductivity type to cause said transistor to be turned ON and OFF, said third logical signal being opposite in polarity to said second logical signal and having said first and second potential levels; said unit logical circuit being so constructed that only one current path is always created between said output terminal and any one of said first, second and third terminals.

2. A logical circuit according to claim 1, comprising a plurality of said unit logical circuits in which at least one of the insulated gate field effect transistors of said other conductivity type, in each unit logical circuit, having the source electrode held at said second potential level and adapted to receive said first logical signal at its gate electrode and the insulated gate field effect transistor of said one conductivity type, in each unit logical circuit, having a source electrode held at said first potential level and adapted to receive said first logical signal at its gate electrode is replaced by a common single insulated gate field effect transistor of the corresponding conductivity type, and the respective second logical signals are supplied to the respective unit logical circuits without being overlapped timewise with respect to each other so that the corresponding outputs can be obtained from the corresponding unit logical circuits without being overlapped timewise with respect to each other.

* * * * *